United States Patent
Khatri et al.

(10) Patent No.: US 10,763,913 B1
(45) Date of Patent: Sep. 1, 2020

(54) LINEAR-IN-DB LOG-AMP WITH CALIBRATION FOR POWER DETECTION

(71) Applicant: Integrated Device Technology, Inc., San Jose, CA (US)

(72) Inventors: Himanshu Khatri, San Diego, CA (US); Samet Zihir, San Diego, CA (US); Tumay Kanar, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 15 days.

(21) Appl. No.: 16/372,698

(22) Filed: Apr. 2, 2019

(51) Int. Cl.
*H04B 1/44* (2006.01)
*H04B 1/18* (2006.01)
*H03F 3/19* (2006.01)
*H03G 3/30* (2006.01)
*H03F 3/04* (2006.01)
*H04B 1/04* (2006.01)

(52) U.S. Cl.
CPC ............ *H04B 1/44* (2013.01); *H03F 3/04* (2013.01); *H03F 3/19* (2013.01); *H03G 3/3036* (2013.01); *H04B 1/04* (2013.01); *H04B 1/18* (2013.01)

(58) Field of Classification Search
CPC .... H04B 1/44; H04B 1/04; H04B 1/18; H03F 3/04; H03F 3/19; H03G 3/3036
See application file for complete search history.

(56) References Cited

U.S. PATENT DOCUMENTS

| 10,379,670 | B1* | 8/2019 | Perez | G06F 3/0383 |
| 2012/0008669 | A1* | 1/2012 | Teraguchi | G01R 21/10 375/224 |
| 2018/0062596 | A1* | 3/2018 | Chan | H03F 3/45273 |
| 2020/0160901 | A1* | 5/2020 | Boujamaa | H03F 3/45264 |

* cited by examiner

*Primary Examiner* — Yuwen Pan
*Assistant Examiner* — Angelica M Perez
(74) *Attorney, Agent, or Firm* — Christopher P. Maiorana, PC

(57) ABSTRACT

An apparatus includes a log amplifier and a calibration circuit. The log amplifier may be configured to generate an output signal in response to an offset between a first voltage and a second voltage. The calibration circuit may be configured to disconnect an input power and perform a cancellation of the offset when the input power is not present. The first voltage may be generated by the apparatus in response to a power detection. The second voltage may be received from a reference circuit. The cancellation of the offset may extend a working range of the apparatus. The output may provide a linear-in-dB power detection.

17 Claims, 13 Drawing Sheets

LINEAR-IN-DB LOG-AMP WITH CALIBRATION FOR POWER DETECTION

FIELD OF THE INVENTION

The invention relates to power detection generally and, more particularly, to a method and/or apparatus for implementing a linear-in-dB log-amp with calibration for power detection.

BACKGROUND

Conventional power detectors are used to monitor input power or output power of a signal. Generally, power detectors are designed to not affect a system when placed in a transmission path. Process, voltage and/or temperature (PVT) variations and/or system noise may result in a mismatch between amplifier inputs. At low power operation, the mismatch may limit an operating range of the power detector. Without accurate measurement and control of gain and reflected power in a wireless transmitter, transmission quality may be poor and/or multi-path issues may result.

Conventional power detectors can implement a linear-in-mag power detector and perform log correction in a digital domain. However, the digital circuitry may be large and/or unsuitable for radio frequency (RF) chips. In mm-wave implementations, linear-in-dB power detectors that are based on saturation are unsuitable due to high power consumption and large area requirements.

It would be desirable to implement a linear-in-dB log-amp with calibration for power detection.

SUMMARY

The invention concerns an apparatus comprising a log amplifier and a calibration circuit. The log amplifier may be configured to generate an output signal in response to an offset between a first voltage and a second voltage. The calibration circuit may be configured to disconnect an input power and perform a cancellation of the offset when the input power is not present. The first voltage may be generated by the apparatus in response to a power detection. The second voltage may be received from a reference circuit. The cancellation of the offset may extend a working range of the apparatus. The output may provide a linear-in-dB power detection.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a linear-in-dB log-amp with calibration for power detection that may (i) implement an offset cancellation circuit for a linear-in-dB power detector, (ii) reduce an input offset when no input power is detected, (iii) eliminate an input offset, (iv) perform a calibration using an open-loop mechanism, (v) perform a calibration using a closed-loop mechanism, (vi) extend a working range of a power detector, (vii) improve power detection sensitivity at low power levels, (viii) provide approximately a 5-10 dB improvement in sensitivity and/or (ix) be implemented as one or more integrated circuits.

Figure 1:
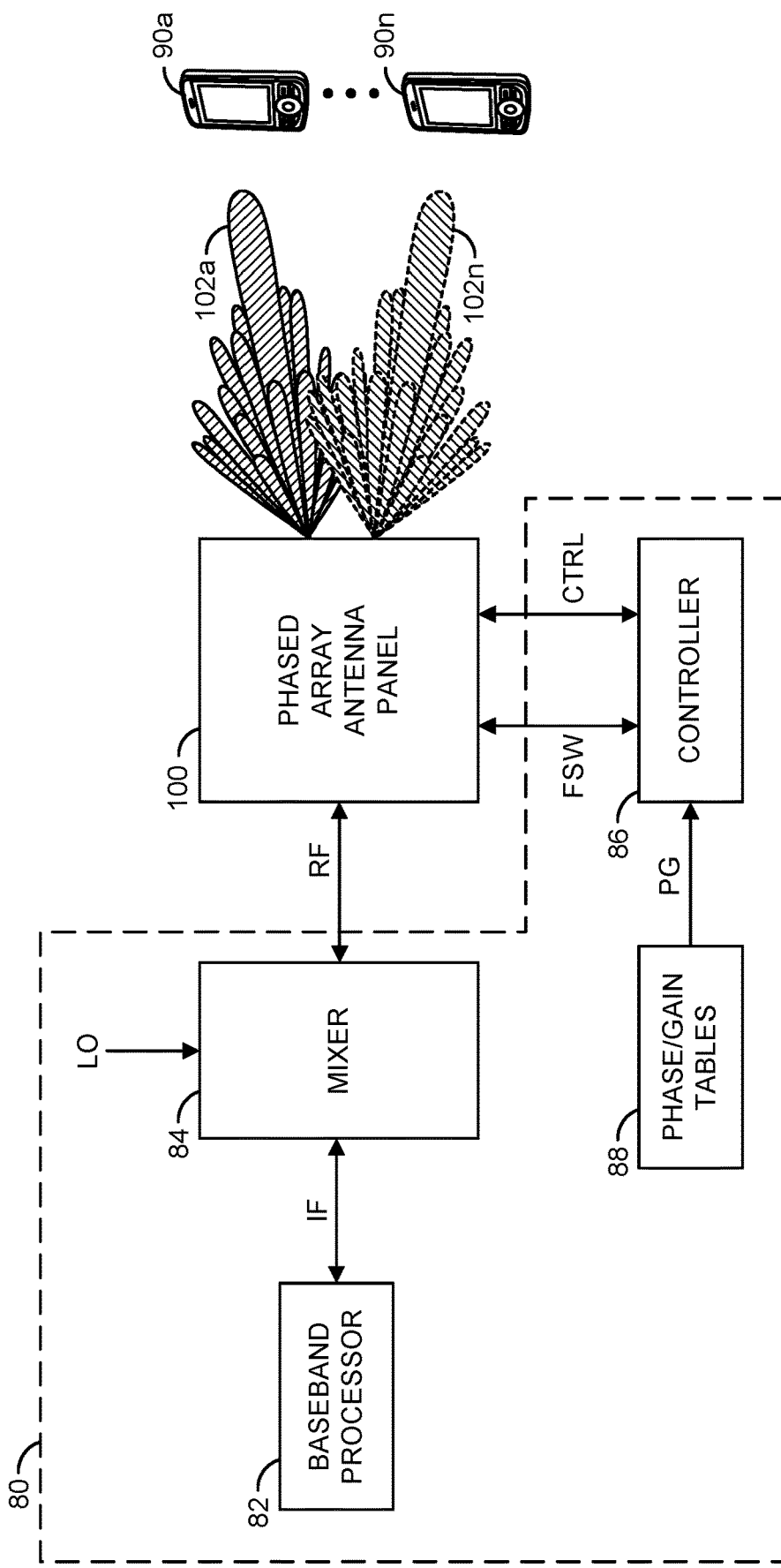
FIG. 1 is a diagram illustrating an example context of the invention.

Referring to FIG. 1, a block diagram of a system 80 is shown illustrating an example context of the invention. The system (or module or circuit or apparatus) 80 may implement a radio-frequency (RF) transceiver system in accordance with an example embodiment of the invention. The RF transceiver system 80 may be configured to operate at common wireless radio frequencies, millimeter-wave frequencies, and/or microwave frequencies. In an example, the RF transceiver system 80 may be configured to facilitate communication with and/or between a plurality of communications devices (or terminals or nodes) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 100 in accordance with an example embodiment of the invention.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G)

wireless communications system (e.g., International Mobile Telecommunications-Advanced (IMT-A) standard published by the International Telecommunications Unit Radiocommunication Sector (ITU-R)), a satellite communication (SATCOM) system, and point-to-point communications systems such as common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. The circuit 82 may implement a baseband processor circuit. The circuit 84 may implement one or more mixer circuits. The circuit 86 may implement a control circuit. The circuit 88 may implement a table of values (e.g., embodied in a memory circuit). In various embodiments, the blocks 82-88 may be implemented with hardware, a combination of hardware and software, and/or simulated with software. The RF transceiver circuit 80 may comprise other components (not shown). The number, type and/or arrangement of the components of the RF transceiver circuit 80 may be varied according to the design criteria of a particular implementation.

A signal (e.g., IF) may be exchanged between the circuit and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 100. The signal RF may be a radio-frequency, millimeter-wave frequency, or microwave frequency signal that conveys the information also found in the intermediate-frequency signal IF.

In a transmit mode, the radio-frequency signal RF may convey information to be broadcast from the phased array antenna panel 100 to the devices 90a-90n. In a receive mode, the radio-frequency signal RF may convey information received from the devices 90a-90n via the phased array antenna panel 100. A signal (e.g., FSW) and a signal or signals (e.g., CTRL) may be exchanged between the circuit 86 and the phased array antenna panel 100. The signal FSW may switch the phased array antenna panel 100 between the transmit mode and the receive mode.

The signal(s) CTRL may convey data, clocking, and control elements. In an example, the signals FSW and CTRL may be part of a digital interface of the phased array antenna panel 100. In an example, the signal(s) CTRL may be implemented as a serial link that conveys information for configuring and/or determining phase and/or gain settings for antenna elements of the phased array antenna panel 100. In an example, the signal(s) CTRL may be compliant with one or more serial communication protocols or interfaces (e.g., serial peripheral interface (SPI), inter-integrated circuit communications ($I^2C$ or $I^3C$), daisy chain, etc.).

A signal or signals (e.g., PG) may be transferred from the circuit 88 to the circuit 86. In an example, the signal(s) PG may convey phase information and gain information used by the circuit 86 to implement (control) beam steering using the phased array antenna panel 100. In an example, the signal(s) PG may convey a plurality of phase and gain values that may be programmed into a plurality of beam former circuits of the phased array antenna panel 100 via the signal(s) CTRL.

The phased array antenna panel 100 generally implements a hard-wired address scheme. The hard-wired address scheme may be used to uniquely identify serial communications intended for elements (e.g., the beam former circuits) of the phased array antenna panel 100. In various embodiments, multiple phased array antenna panels 100 may be combined to form a larger antenna array that may provide more transmission channels. The multiple phased array antenna panels may share a serial communication channel, link, or bus. Each of the phased array antenna panels 100 making up the larger antenna array may be uniquely addressed using respective hard-wired addresses.

The phased array antenna panel 100 may generate one or more fields (or beams) 102a-102n. The fields 102a-102n may represent a field pattern (or radio-frequency beam pattern) created by the beam former circuits of the phased array antenna panel 100 based upon the phase and gain information (values) received via the signal(s) CTRL. The phased array antenna panel 100 may be configured to produce directional beams 102a-102n for communication with the communication devices 90a-90n. In an example, the phased array antenna panel 100 may be controlled to steer the beams 102a-102n, based on the phase and gain information received via the signal(s) CTRL, to track movement of the communication devices 90a-90n and/or switch between the communication devices 90a-90n.

The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90a-90n.

The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4 GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

In various embodiments, the circuit 86 may be implemented using one or more of an application specific integrated circuit (ASIC), controller, microprocessor, or circuitry configured accordingly. The circuit 86 is generally operational to control the operations of the phased array antenna panel 100. In some embodiments, the circuit 86 may determine the setting values used in each transceiver channel within the beam former circuits of the phased array antenna panel 100. The setting values may establish the geometry of the field(s) or beam(s) 102a-102n. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the phased array antenna panel 100 to establish the fields 102a-102b. The phase values and the gain values may be fetched from the circuit 88 via the signal PG and programmed into buffers associated with the beam former circuits of the phased array antenna panel 100 by the circuit 86. In various embodiments, the circuits 86 and 88 may be implemented either on the same integrated circuit or on different (separate) integrated circuits.

In an example, the phased array antenna panel 100 may be implemented comprising either single-polarization (or single-pole) antenna elements or dual-polarization (or dual-pole or di-pole) antenna elements. The phased array antenna panel 100 may be operational to transmit and receive wireless signals to and from the devices (or terminals) 90a-90n. The devices (or terminals) 90a-90n may be remotely located from the RF transceiver system 80. Sensitivity to the wireless signals may be determined by the fields 102a-102n created by the phased array antenna panel 100. The phased array antenna panel 100 may comprise a plurality of antenna elements and a plurality of beam former circuits. Each beam former circuit may implement a plurality of transceiver channels. Each transceiver channel generally comprises a transmit channel and a receive channel. The transceiver channels may be coupled to the antenna elements by corresponding bidirectional radio-frequency signals. The transceiver channels and antenna elements generally form a two-dimensional antenna network.

Figure 2:
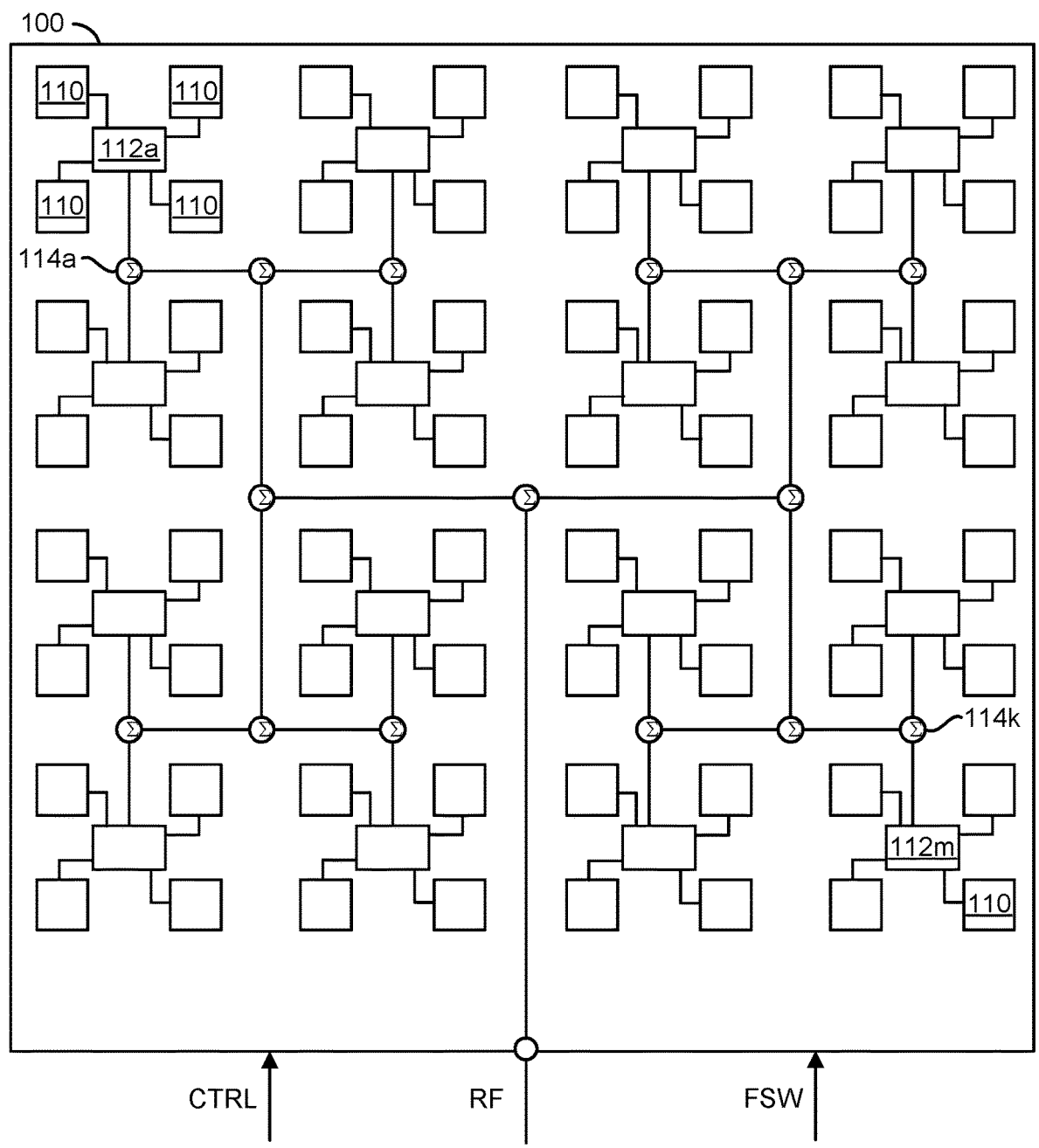
FIG. 2 is a diagram illustrating an example implementation of a single-polarization phased array antenna panel in accordance with an example embodiment of the invention.

Referring to FIG. 2, a diagram is shown illustrating an example implementation of a single-polarization version of the phased array antenna panel 100 in accordance with an embodiment of the invention. In an example, the phased array antenna panel 100 may comprise a number of blocks (or circuits) 110, a number of blocks (or circuits) 112a-112m, and a number of blocks (or circuits) 114a-114k. In embodiments implementing a single-polarization phased array antenna panel, the blocks 110 generally are implemented as single polarization (or single-pole) antenna elements. Each of the circuits 112a-112m may implement a single-polarization beam former circuit. Each of the circuits 114a-114k may implement a combiner/splitter circuit. The circuits 112a-112m, and 114a-114k may be implemented with hardware, a combination of hardware and software, and/or simulated with software. In an example, the signal RF may be exchanged with one of the circuits 114a-114k and distributed by or combined by a remainder of the circuits 114a-114k. The signals FSW and CTRL may be exchanged with the circuits 112a-112m.

The antenna elements 110 in the phased array antenna panel 100 may be used for both transmission and reception. A physical positioning of the antenna elements 110 generally provides for two-dimensional (e.g., horizontal and vertical) control of the fields 102a-102n. In an example, the antenna elements 110 may be arranged in a 2-dimensional (e.g., N×N) grid pattern, where N is an integer value divisible by 2. However, other dimensions of grid patterns may be implemented accordingly to meet design criteria of a particular implementation.

The circuits 112a-112m are generally operational to multiplex/demultiplex the signal RF with a number of the antenna elements 110. In various embodiments, each of the circuits 112a-112m may be mounted on a substrate of the phased array antenna panel 100 adjacent to (e.g., centered among) a number (or group) of the antenna elements 110. In an example, each circuit 112a-112m generally comprises a number of transceiver channels that are coupled to respective antenna elements 110. In an example, each circuit 112a-112m may be coupled to four adjacent antenna elements 110 (e.g., arranged in a 2×2 grid around each circuit 112a-112m). However, other numbers (e.g., 1, 2, 4, 18, etc.) of adjacent antenna elements 110 may be implemented to meet design criteria of a particular implementation. The circuits 112a-112m may be configured to switch between a transmit mode and a receive mode in response to the signal FSW. In the transmit mode, the circuits 112a-112m may be operational to rapidly change setting values (e.g., phase values, gain values, etc.) used by the transceiver channels in order to steer the beams (or fields) 102a-102n formed by the phased array antenna panel 100. In various embodiments, each of the circuits 112a-112m may be implemented as one or more integrated circuits (e.g., in a package or multi-chip module (MCM)).

In various embodiments, each of the circuits 114a-114k may be implemented as a combiner/splitter circuit. In an example, the circuits 114a-114k may be implemented as Wilkinson combiner/splitters. In various embodiments, the circuits 114a-114k may be coupled together to form a network that couples the circuits 112a-112m to an input/output of the phased array antenna panel 100 configured to present/receive the signal RF. In the transmit mode, the circuits 114a-114k are generally operational to distribute the power in the signal RF among the circuits 112a-112m. In the receive mode, the circuits 114a-114k may be operational to combine the power received in signals from the circuits 112a-112m into the signal RF. The circuits 112a-112m and 114a-114k are generally configured to provide a substantially equivalent path length between the RF input/output of the phased array antenna panel 100 and each of the circuits 112a-112m.

In embodiments implementing a dual-polarization version of the phased array antenna panel 100, the antenna elements 110 may be implemented having horizontal and vertical feed ports. The circuits 112a-112m may be configured to be coupled to each respective antenna element 110 by both horizontal and vertical antenna input/outputs. A first set of the circuits 114a-114k may be coupled together to form a first network that couples the circuits 112a-112m to a first input/output of the phased array antenna panel 100 configured to present/receive a horizontal RF signal (e.g., RFH). A second set of the circuits 114a-114k may be coupled together to form a second network that couples the circuits 112a-112m to a second input/output of the phased array antenna panel 100 configured to present/receive a vertical RF signal RFV.

Figure 3:
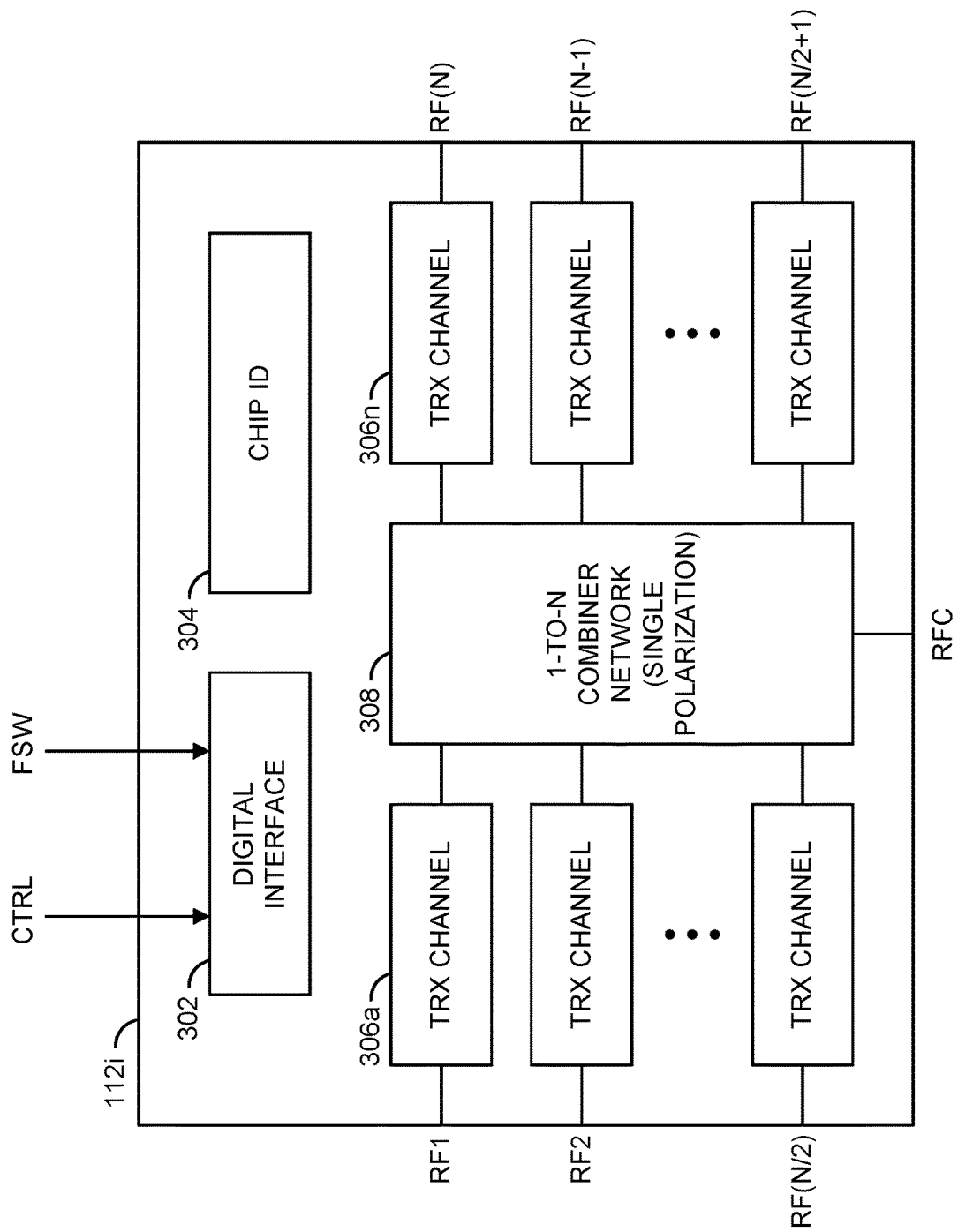
FIG. 3 is a diagram illustrating a single-polarization beam former circuit in accordance with an example embodiment of the invention.

Referring to FIG. 3, a diagram is shown illustrating an example implementation of a single-polarization beam former circuit 112i in accordance with an example embodiment of the invention. In an example, the single-polarization beam former circuit 112i may be representative of the single-polarization beam former circuits 112a-112m of FIG. 2. In an example, the single-polarization beam former circuit 112i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation.

In various embodiments, the signal RF may be presented/received by the common RF input/output RFC, and the antenna input/output ports RF1-RFN may be coupled to respective antenna elements 110. The single-polarization beam former circuit 112*i* generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting or receiving based upon the signal FSW.

The single-polarization beam former circuit 112*i* generally implements a transmit mode and a receive mode. In an example, a state of the signal FSW may determine whether the transmit mode or the receive mode is active. In the transmit mode, the single-polarization beam former circuit 112*i* is generally configured to receive the radio frequency signal RF at the common input/output port RFC and present radio frequency signals at the antenna input/output ports RF1-RFN. The signals presented at each of the antenna input/output ports RF1-RFN are generated by the single-polarization beam former circuit 112*i* in response to the radio frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 112*i* is generally configured to combine radio frequency signals received at the antenna input/output ports RF1-RFN for presentation as the signal RF at the common input/output port RFC.

The single-polarization beam former circuit 112*i* may comprise a block (or circuit) 302, a block (or circuit) 304, a number of blocks (or circuits) 306*a*-306*n*, and a block (or circuit) 308. The circuit 302 may implement an interface circuit. In various embodiments, the circuit 302 may implement a digital interface. The circuit 304 may implement a hard-wired address (e.g., chip ID) for the beam former circuit 112*i*. The circuits 306*a*-306*n* may implement transceiver (TRX) channels. The circuit 308 may implement a 1-to-N combiner/splitter network. The single-polarization beam former circuits 112*a*-112*m* may each comprise other components (not shown). The number, type and/or arrangement of the components implemented by each of the single-polarization beam former circuits 112*a*-112*m* may be varied according to the design criteria of a particular implementation.

In an example, the signals FSW and CTRL are exchanged with the circuit 302. In an example, the circuit 302 may comprise a serial interface. The circuit 302 may be configured to be compliant with one or more serial interface standards including, but not limited to, serial peripheral interface (SPI), inter-integrated circuit ($I^2C$ or $I^3C$), daisy chain, etc. In an example, the circuit 302 may be configured to allow programming and control of the single-polarization beam former circuit 112*i* using a serial communication link (or bus). In an example, the circuit 302 may be configured to program and control the circuits 306*a*-306*n* in response to the signals CTRL and FSW. In an example, the circuit 302 may control whether the circuits 306*a*-306*n* operate in a transmit mode or a receive mode in response to the signal FSW. In an example, the circuit 302 may implement a 4-wire embedded SPI core. In an example, the circuit 304 may set a physical address of the beam former circuit 112*i* based upon hardware coded address bits (or pins). In some embodiments, the hard-wired address bits may be hard coded within the chip implementing the beam former circuit 112*i*. In some embodiments, the hard-wired address bits may be programmable within the chip implementing the beam former circuit 112*i* during manufacturing. In an example, the hard-wired address bits may be programmed using fuses, anti-fuses, or other conventional techniques.

In embodiments implementing a dual-polarization, the beam former circuit 112*i* may be implemented similarly, except that each transceiver channel may be configured to provide separate horizontal and vertical antenna input/outputs (e.g., RFH1 and RFV1, RFV(N) and RFV(N)), and the circuit 308 may be configured to couple the circuit 112*i* to separate horizontal and vertical common input/output ports (e.g., RFHC and RFVC).

Figure 4:
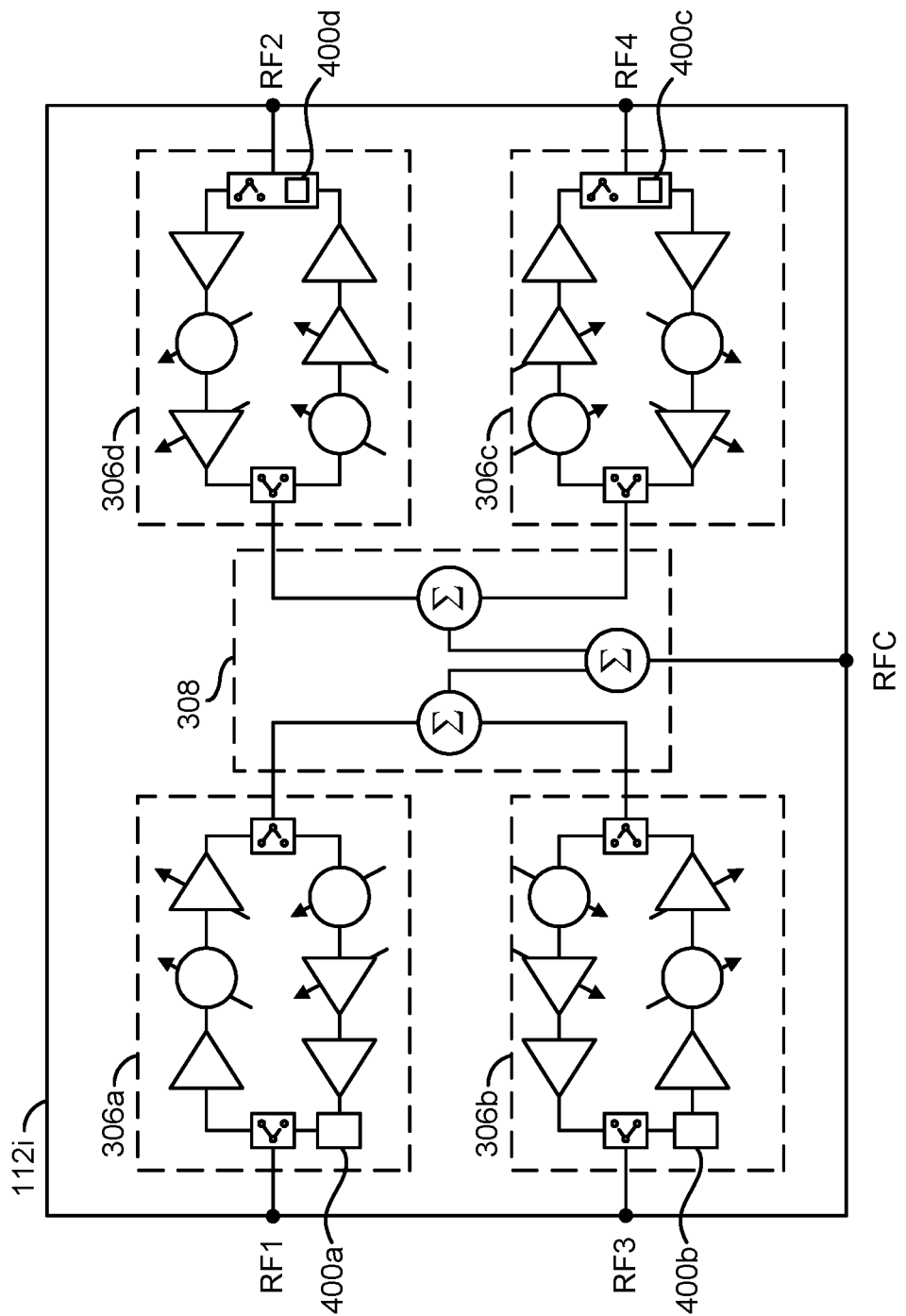
FIG. 4 is a diagram illustrating an example implementation of a generic 2×2 four-element single-polarization transceiver beam former circuit in accordance with an example embodiment of the invention.

Referring to FIG. 4, a diagram is shown illustrating an example implementation of a generic 2×2 four-element single-polarization transceiver beam former circuit 112*i* in accordance with an example embodiment of the invention. In various embodiments, beam former circuits may implement a plurality of transceiver channels. Each transceiver channel generally comprises a transmit channel and a receive channel. In an example, the 2×2 four-element single-polarization transceiver beam former circuit 112*i* may implement four transceiver channels (or circuits) 306*a*-306*d*. The four transceiver channels 306*a*-306*d* may be coupled to respective antenna elements in a group of adjacent antenna elements by corresponding bidirectional radio-frequency signals (e.g., RF1-RF4). The transceiver channels and antenna elements generally form a two-dimensional antenna network.

In an example, the circuit 308 may be implemented as a 1-4 combiner/splitter network. In an example, the circuit 308 may comprise a number of combiner/splitters. In an example, the combiner/splitters may be implemented as Wilkinson combiner/splitters. In various embodiments, the combiner/splitters may be coupled together to form a network that couples the circuits 306*a*-306*d* to a common RF input/output port RFC of the beam former circuit 112*i*. In the transmit mode, the circuit 308 is generally operational to distribute the power in a signal at the common RF input/output port RFC among the circuits 306*a*-306*d*. In the receive mode, the circuit 308 may be operational to combine the power received in signals from the circuits 306*a*-306*d* into a signal presented at the common RF input/output port RFC. The circuits 306*a*-306*d* and 308 are generally configured to provide a substantially equivalent path length between the common RF input/output port RFC and each of the circuits 306*a*-306*d*. The topology of the beam former circuit 112*i* may be scaled to provide other numbers of transceiver channels to meet the design criteria of a particular implementation.

In embodiments implementing dual-polarization phased array antenna panel, a 2×2 four-element dual-polarization transceiver beam former circuit may implement similarly to the transceiver beam former circuit 112*i*, except with two instances of the four transceiver channels 306*a*-306*d* and network 308: a first instance configured for the horizontal transceiver channels; and a second instance configured for the vertical channels.

An apparatus (or block, or circuit, or module) 400*a* is shown within the transceiver circuit 306*a*. Similarly, circuits 400*b*-400*d* may be implemented within a respective one of the transceiver circuits 306*b*-306*d*. The circuits 400*a*-400*d* may each implement a power detector. In one example, each of the circuits 400*a*-400*d* may have a similar implementation.

In the example shown, the power detector 400*a* may be implemented in a transmitter chain (or transmit path) of the transceiver circuit 306*a*. The power detector 400*a* is shown as a component separate from a transmit-receive RF switch (to be described in association with FIG. 5). In the example shown, the power detector 400b may be implemented in a receiver chain (or receive path) of the transceiver circuit 306b. The power detector 400b is shown as a component separate from a transmit-receive RF switch. In the example shown, the power detector 400c may be implemented in a transmitter chain (or transmit path) of the transceiver circuit 306c. The power detector 400c is shown as a component implemented within a transmit-receive RF switch. In the example shown, the power detector 400d may be implemented in a receiver chain (or receive path) of the transceiver circuit 306d. The power detector 400d is shown as a component within the transmit-receive RF switch. For example, implementing the power detectors 400c-400d within the transmit-receive RF switch may prevent losses (e.g., compared to a separate power detection block) and/or not use extra area for a separate component.

The power detector circuits 400a-400d implemented within each of the transceiver circuits 306a-306d may be representative examples of embodiments of the invention. In one example, the transceiver circuits 306a-306d may each implement one of the power detectors 400a. In another example, the transceiver circuits 306a-306d may each implement one of the power detectors 400b. In some embodiments, each of the transceiver circuits 306a-306d may implement each of the circuits 400a-400d. The implementation of the power detector circuits 400a-400d within the transceiver circuits 306a-306d may be varied according to the design criteria of a particular implementation.

Figure 5:
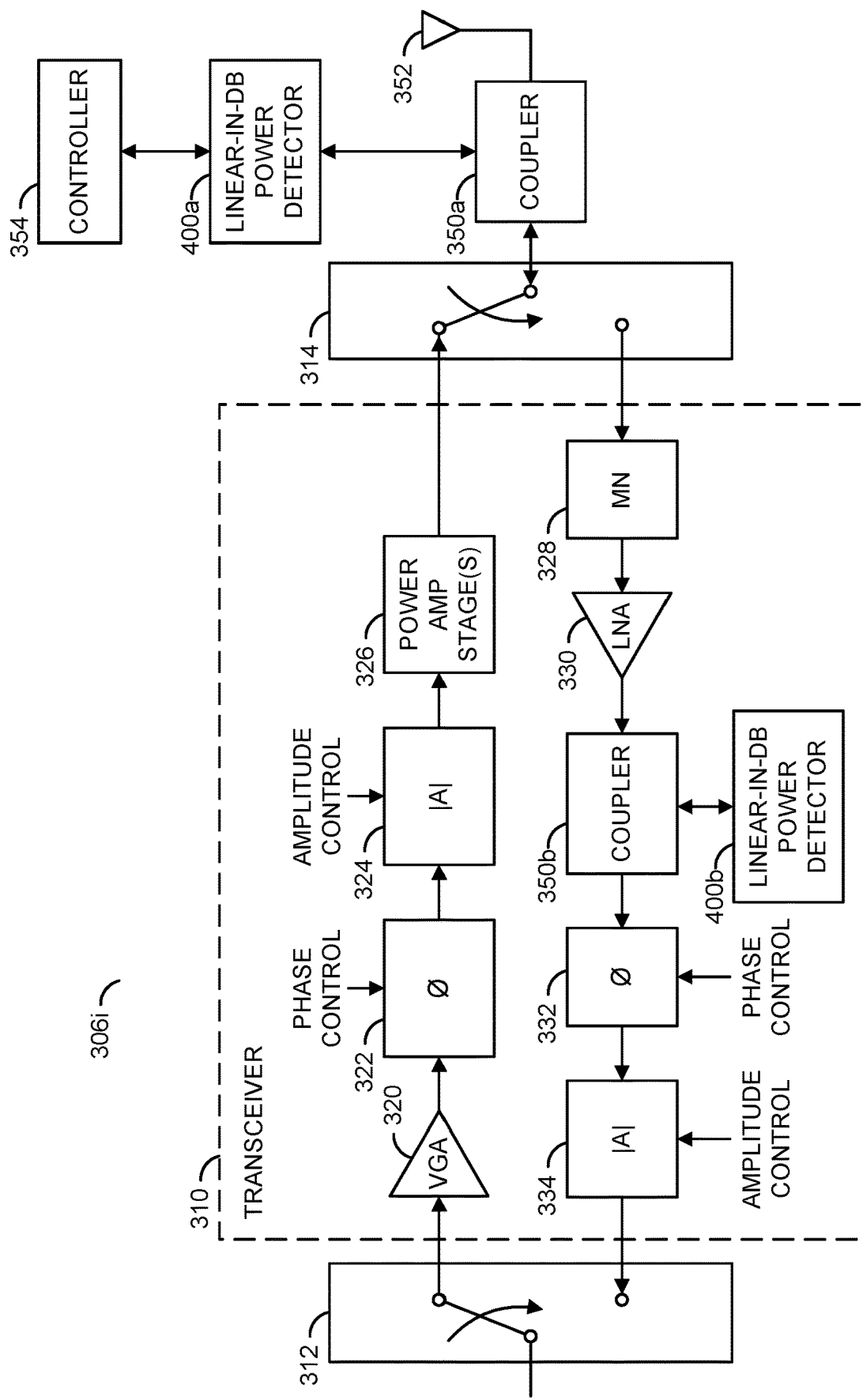
FIG. 5 is a diagram illustrating an example implementation of a transceiver channel with a power detection circuit.

Referring to FIG. 5, a block diagram of a transceiver circuit 306i is shown illustrating an example radio frequency (RF) amplifier application in accordance with an embodiment of the invention. In an example, the transceiver circuit 306i may be representative of the single-polarization beam former transceiver circuits (or channels) 306a-306d of FIG. 4. In another example, the transceiver circuit 306i may be representative of either horizontal or vertical beam former transceiver circuits (or channels) of a dual-polarization beam former circuit (or chip). In an example embodiment, the circuit 306i may comprise a block (or circuit) 310, a block (or circuit) 312, and a block (or circuit) 314. In an example embodiment, the circuit 310 may implement a transceiver circuit. The blocks 312 and 314 may implement transmit-receive (T/R) switches. A transceiver circuit is generally capable of both transmitting and receiving signals of a communication channel. In various embodiments, the circuit 310 may be capable of transmitting and receiving radio frequency (RF), microwave, and/or millimeter-wave signals.

In various embodiments, the circuit 310 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 310 may be representative of a radar application including, but not limited to target detection, ranging, and/or through-wall imaging. In an example, the transceiver circuit 310 generally comprises both a transmitter chain and a receiver chain. Both the transmitter chain and the receiver chain may comprise radio frequency (RF) amplifiers.

In an example, the transmitter chain may include an input amplifier 320, a variable (programmable) phase shifter 322, a variable (programmable) attenuator 324, and one or more output amplifier stages 326. In one example, the input amplifier 320 may be implemented as a variable gain amplifier (VGA). In another example, the input amplifier 320 may be implemented as a low noise amplifier (LNA). The output amplifier stages 326 may include drivers, pre-amplifiers, and/or power amplifiers. In an example, the receiver chain may include a limiter (or protection) and filter (MN) circuit 328, a low noise amplifier (LNA) 330, a variable (programmable) phase shifter 332, and a variable (programmable) attenuator 334. In an example, an input of the transmitter chain and an output of the receiver chain may be coupled to a transmission line or an RF transceiver system by the RF switch 312. In an example, an output of the transmitter chain and an input of the receiver chain may be coupled to a transmission line or an antenna by the RF switch 314. The transmitter chain and/or the receiver chain may comprise other components (not shown). The number, type and/or arrangement of the components of the transmitter chain and/or the receiver chain may be varied according to the design criteria of a particular implementation.

In various embodiments, the variable phase shifter 322, the variable attenuator 324, the variable phase shifter 332, and the variable attenuator 334 may be implemented using conventional techniques. In general, the amplifier circuits of the transceiver circuit 310 may provide improved linearity for wideband modulated signals by utilizing a bias network (or circuit) in accordance with an embodiment of the invention.

The transceiver circuit 306i may further comprise blocks (or circuits) 350a-350b, an antenna 352, a block (or circuit) 354 and/or power detectors 400a-400b. The circuits 350a-350b may implement couplers. The circuit 354 may implement a controller circuit.

In the example shown, the coupler 350a is shown implemented between the transmit-receive RF switch 314 and the antenna 352 (e.g., to provide the transmit power estimate). The power detector 400a is shown connected to the coupler 350a. Generally, the power detector 400a may be implemented at the output of the transmit path (e.g., as close to the antenna 352 as possible). Placing the coupler 350a and/or the power detector 400a close to the antenna 352 may provide an accurate estimate of the radiated power. A system calibration may be performed based on the estimate of the radiated power. In some embodiments, the coupler 350a and/or the power detector 400a may be bi-directional. The bi-directional power detector 400a may provide the estimate of the transmitted power and an estimate of power reflected back. The estimate of the transmitted power and the power reflected back may be used to determine an antenna match. In the context of the phased array antenna panel 100, an accurate estimate of the transmitted power may be used to construct the radiation beams 102a-102b, by calibrating array elements 110.

In the example shown, the coupler 350b is shown implemented between the LNA 330 and the variable phase shifter 332 in the receive path. The power detector 400b is shown connected to the coupler 350b. Implementing the coupler 350b after the LNA 330 may enable the amplified signal to be provided to the power detector 400b with a minimal noise feedback hit. Implementing the power detector 400b in the receive path may enable detecting strong blockers and/or changing a receive gain/linearity mode.

In some embodiments, one of the couplers 350a-350b (and the power detectors 400a-400b) may be integrated in the transmit-receive RF switch 314. Implementing the couplers 350a-350b may enable the power detectors 400a-400b to be implemented outside of the transmit (or receive) path. The output of the couplers 350a-350b may feed the power detectors 400a-400b.

The controller 354 may be configured to send and/or receive signals to/from the power detector 400a. In one example, the controller 354 may be a digital control circuit. In some embodiments, the controller 354 may be implemented off-chip (e.g., separate from the transceiver circuit 310) and the output from the power detectors 400a-400b may be sent back to the off-chip digital controller 354 (e.g., which would then provide signals to control the transceiver circuit 310 and/or the power detector 400a). In another example, the controller 354 may be the controller 86 shown in association with FIG. 1 (e.g., the controller 354 may present the signal CTRL to the power detector 400a and/or may be part of the digital interface of the phased array antenna panel 100). In some embodiments, the controller 354 may implement an amplitude control circuit configured to provide feedback to the amplitude controller 324 and/or the amplitude controller 334 (e.g., the output of the power detectors 400a-400b may be used to determine an attenuation of the amplitude of the RF signal). The implementation of the controller 354 may be varied according to the design criteria of a particular implementation.

The power detectors 400a-400b may be configured to measure the transmitted and/or reflected power to enable precise and fast control. The monitoring performed by the power detectors 400a-400b may provide information that may reduce power consumption and improve system performance (e.g., optimize performance of the transceiver circuit 310). The power detectors 400a-400b may each be configured to implement a linear-in-dB power detector.

The linear-in-dB power detectors 400a-400b may be configured to implement a wide range of RF and microwave applications. An output of the linear-in-dB power detectors 400a-400b may provide an output voltage (e.g., a DC output voltage). The output voltage of the linear-in-dB power detectors 400a-400b may provide an accurate representation of the average signal power applied to the RF input. The linear-in-dB power detectors 400a-400b may provide a true power measurement of RF and microwave signals independent of modulation and waveforms.

Generally, the linear-in-dB power detectors 400a-400b may not be implemented directly in the signal chain. In one example, the linear-in-dB power detectors 400a-400b may be implemented as part of a closed-loop control configured to adjust the receive-channel and/or transmit-channel gain via automatic gain/power control (e.g., to maintain a near-constant signal level and/or control transmitted power in the channel by measuring input signal strength over a wide range). The output may be based on an absolute value of the input. The output of the linear-in-dB power detectors 400a-400b may be a decibel-scaled measure of average power. Based on the power measured by the linear-in-dB power detectors 400a-400b, the gain (e.g., the amplitude controller 324 and/or 334) may be varied until a correct output power is measured.

The linear-in-dB power detectors 400a-400b may implement a linear-in-dB transfer function. The linear-in-dB transfer function may be used to measure gain and/or return loss. For example, the measurement of gain and/or reflected power may be critical features in a wireless transmitter. In one example, the power detector 400a may be configured to measure power reflected back from the antenna 352 using the voltage standing wave ratio and/or the reflection coefficient (e.g., return loss). The linear-in-dB power detectors 400a-400b may be configured to provide an output that may be used to prevent multi-path errors, poor quality of transmissions and/or violations of standards.

Figure 6:
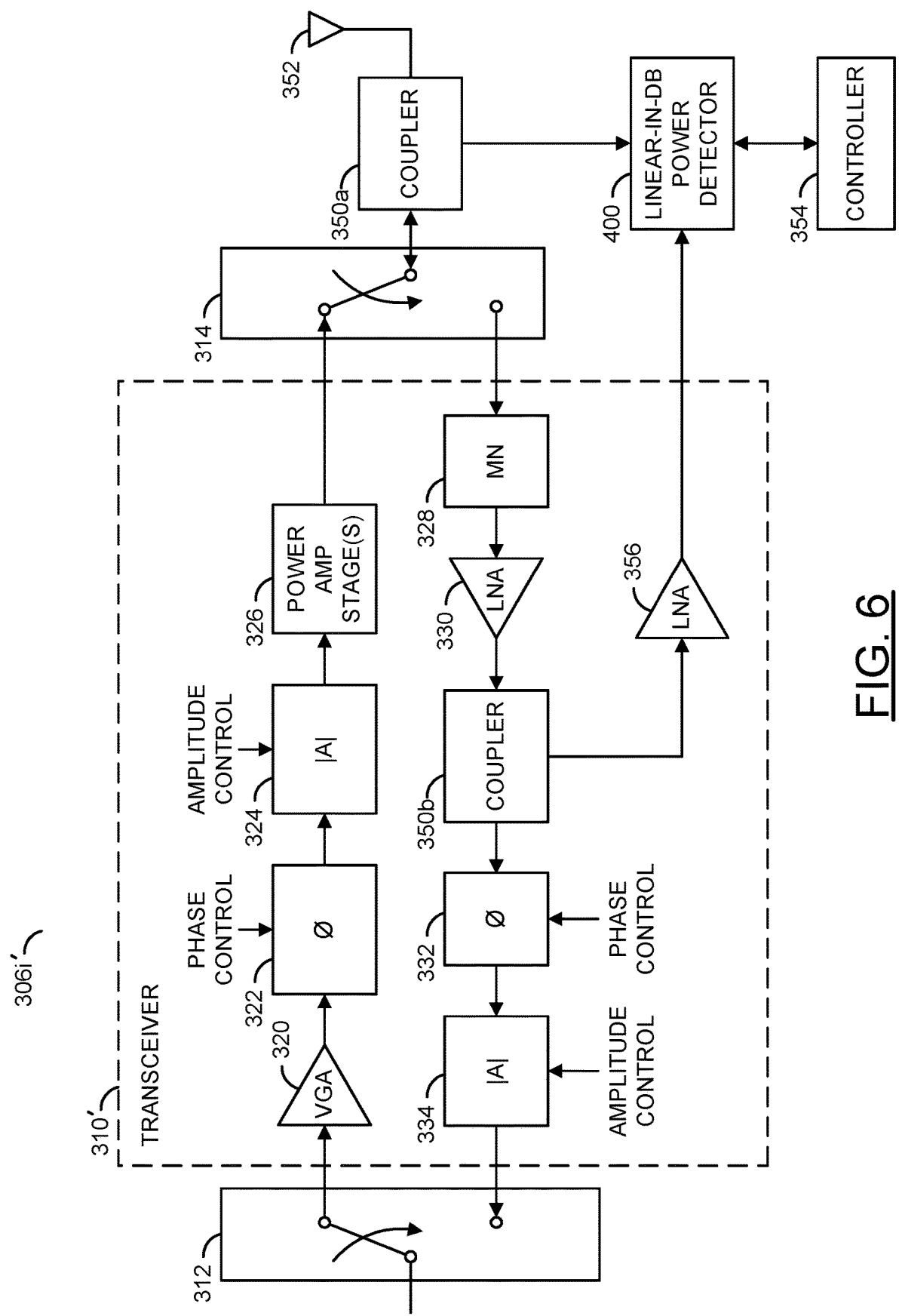
FIG. 6 is a diagram illustrating an example implementation of a transceiver channel with a shared power detection circuit.

Referring to FIG. 6, a diagram illustrating an example implementation of the transceiver channel 306i' with a shared power detection circuit is shown. The transceiver channel 306i' may comprise the transceiver circuit 310', the transmit-receive (T/R) switch 312, transmit-receive (T/R) switch 314, the coupler 350a, the antenna 352 and/or the linear-in-dB power detector 400. An alternate embodiment of the transceiver circuit 310' is shown. The transceiver channel 306i' and/or the transceiver circuit 310' may have a similar implementation as the transceiver channel 306i and the transceiver circuit 310 as described in association with FIG. 5.

The linear-in-dB power detector 400 may implement a shared power detector. In an example, the linear-in-dB power detector 400 may be configured to perform the power detection for both the transmit path and the receive path. The coupler 350a may provide the input RF power from the transmit path (e.g., from the antenna 352). The coupler 350b may provide the input RF power from the receive path. The transceiver 310' is shown comprising an amplifier 356 connected to the coupler 350b. The amplifier 356 may be configured to bring the power levels from the receive path to a similar level as the transmit path (e.g., to ensure that input power levels for the shared power detector 400 are compatible).

The linear-in-dB power detector 400 may be configured as part of an operational loop of the circuit 306i' for transmitting power. In an example, the linear-in-dB power detector 400 may detect the transmit power (e.g., the coupler 350a may provide the power transmitted by the antenna 352). The linear-in-dB power detector 400 may feed the detected power to the controller 354. The controller 354 may perform adjustments in response to the detected power to enable the circuit 306i' to achieve the desired output power level. During operation (e.g., during transmission), a loop comprising the linear-in-dB power detector 400 may be closed. The linear-in-dB power detector 400 may be configured to perform a calibration (e.g., when there is no RF input). During the calibration, the loop comprising the linear-in-dB power detector 400 may be open. A similar calibration may be performed based on readings from the linear-in-dB power detector 400 corresponding to the receive path (e.g., from the coupler 350b and the amplifier 356).

Figure 7:
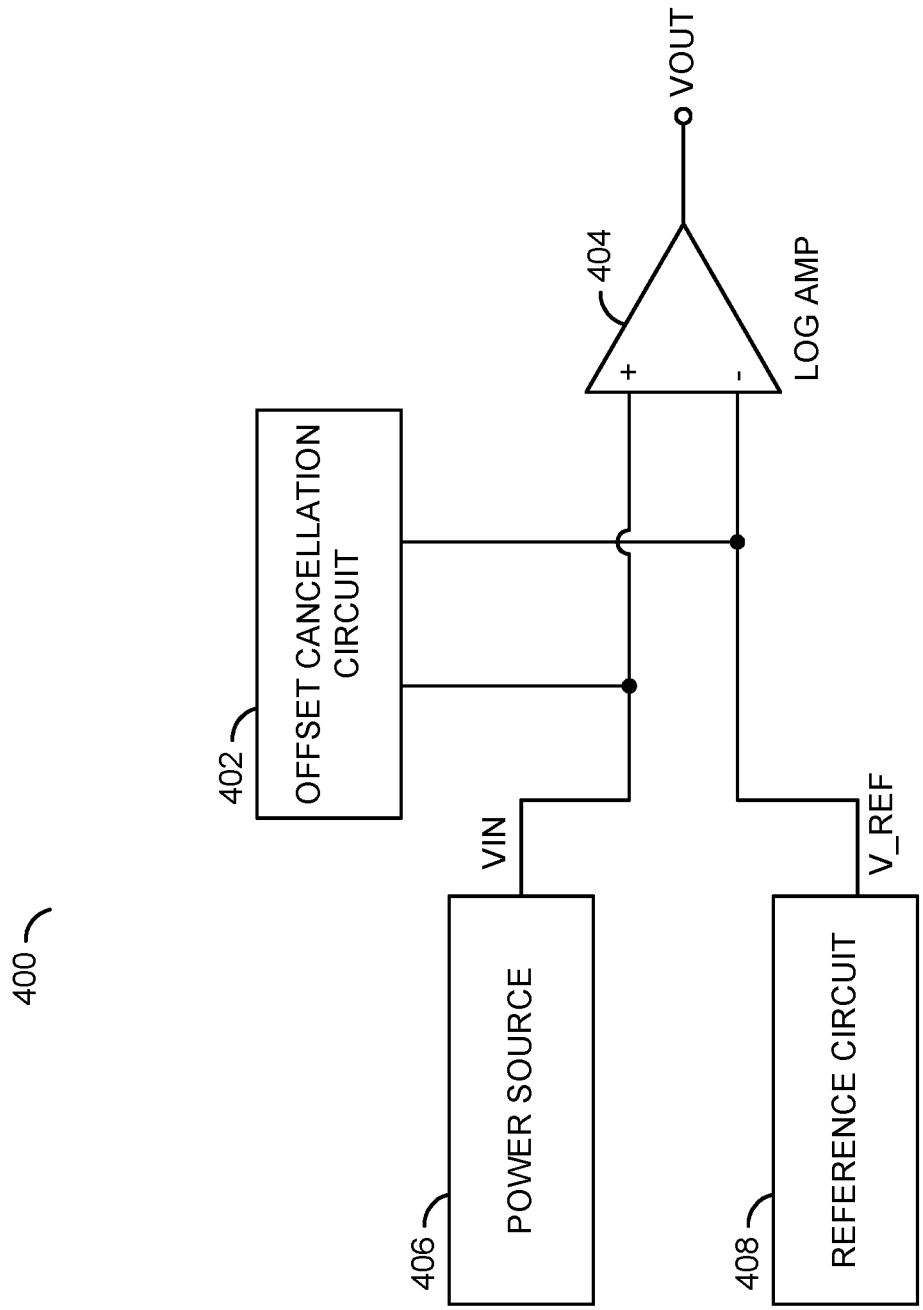
FIG. 7 is a block diagram illustrating an example linear-in-dB power detector with calibration.

Referring to FIG. 7, a block diagram illustrating an example linear-in-dB power detector with calibration 400 is shown. The linear-in-dB power detector with calibration 400 may be a representative example of one of the power detectors 400a-400d shown in association with FIG. 4 and/or FIG. 5. The linear-in-dB power detector with calibration 400 may comprise a block (or circuit) 402, a block (or circuit) 404, a block (or circuit) 406 and/or a block (or circuit) 408. The circuit 402 may implement an offset cancellation (or calibration) circuit. The circuit 404 may implement an amplifier. The amplifier 404 may be a log amplifier. The block 406 may be a power source. The circuit 408 may implement a reference circuit. The linear-in-dB power detector with calibration 400 may comprise other components (not shown). The number, type and/or arrangement of the components of the linear-in-dB power detector with calibration 400 may be varied according to the design criteria of a particular implementation.

The power source 406 may generate a signal (e.g., VIN). The signal VIN may be provided as an input to a positive terminal of the log amplifier 404. The reference circuit 408 may generate a signal (e.g., V_REF). The signal V_REF may be provided as an input to a negative terminal of the log amplifier 404. The log amplifier 404 may present an output signal (e.g., VOUT). In an example, the signal VOUT may be a decibel-scaled measure of average power.

The power source 406 may be a source of RF input power. In one example, the power source 406 may be from a signal received from the antenna 352 (e.g., communicated along the receiver path of the transceiver circuit 310). In another example, the power source 406 may be from a signal from the transmit-receive RF switch 314 (e.g., received from the transmit path of the transceiver circuit 310) that may be communicated to the antenna 352. In still another example, the power source 406 may be from a signal reflected from the antenna 352 (e.g., when transmitting the signal from the transmit path of the transceiver circuit 310). Generally, one of the couplers 350*a*-350*b* may be configured to provide the power detector 400 with input power voltage out of the signal chain in response to a signal being communicated by the phased array antenna panel 100. In one example, the power source 406 may be represented as a linear-in-magnitude power detector circuit.

The reference circuit 408 may be a circuit configured to provide a reference input to the log amplifier 404. The reference circuit 408 may be configured to enable the log amplifier 404 to provide an absolute measurement of the power.

The offset cancellation circuit 402 may be configured to perform a calibration of the log amplifier 404. The calibration performed by the offset cancellation circuit 402 may reduce and/or eliminate an offset between the negative terminal and the positive terminal of the log amplifier 404 when no RF power is present. For example, the offset may be a result of mismatches and/or PVT variations. The calibration performed by the offset cancellation circuit 402 may extend the working range of the power detector 400. The offset cancellation circuit 402 may perform the calibration by sampling the input to the positive terminal and the negative terminal of the log amplifier 404 in an open loop configuration. The implementation of the calibration may be varied according to the design criteria of a particular implementation. Details of the calibration may be described in association with FIGS. 8-11.

The log amplifier 404 may be configured to generate the signal VOUT in response to a difference (e.g., an offset) between a signal at the positive terminal and the negative terminal. The log amplifier 404 may be configured for RF-transceiver applications. In an example, the output VOUT may provide a RF-signal strength that may be used to control a transmission power of the transceiver circuit 310. For example, the log amplifier 404 may be configured to compress and/or demodulate RF signals. The output VOUT may be logarithm of an envelope of the rectified input power signal. Generally, the output signal VOUT may be generated based on an absolute value of the input (e.g., a signal VOUT may be a positive value regardless of whether the input is positive or negative).

Generally, the output VOUT measured in dB may be proportional to the difference between the positive terminal and the negative terminal of the log amplifier 404. In an example, the output VOUT may be used to determine the return loss in dB. The log amplifier 404 may be configured to deliver the output voltage VOUT proportional to the log of the input signal over a large working range (e.g., up to 100 dB). The temperature stability of the log amplifier 404 may be constant over the working range. In an example, the controller 352 may be configured to measure gain and/or voltage standing wave ratio in response to the signal VOUT using subtraction of the logarithmic output (e.g., instead of performing a division of a linear output). The logarithmic output of the log amplifier 404 may enable other components of the system 80 (e.g., the controller 86 and/or the controller 354) to perform a log correction in an analog domain.

The output of the power source 406 and the output of the reference circuit 408 may be compared and fed to the log amplifier 404 to generate the linear-in-dB power detection. Without calibration performed by the calibration circuit 402, the log amplifier 404 may have a working range that may be limited at lower power. For example, the working range may be limited because of a mismatch between the positive terminal and the negative terminal of the log amplifier 404 when there is no RF input. The calibration performed by the offset cancellation circuit 402 may reduce the mismatch, which may extend the working range of the power detector 400.

Figure 8:
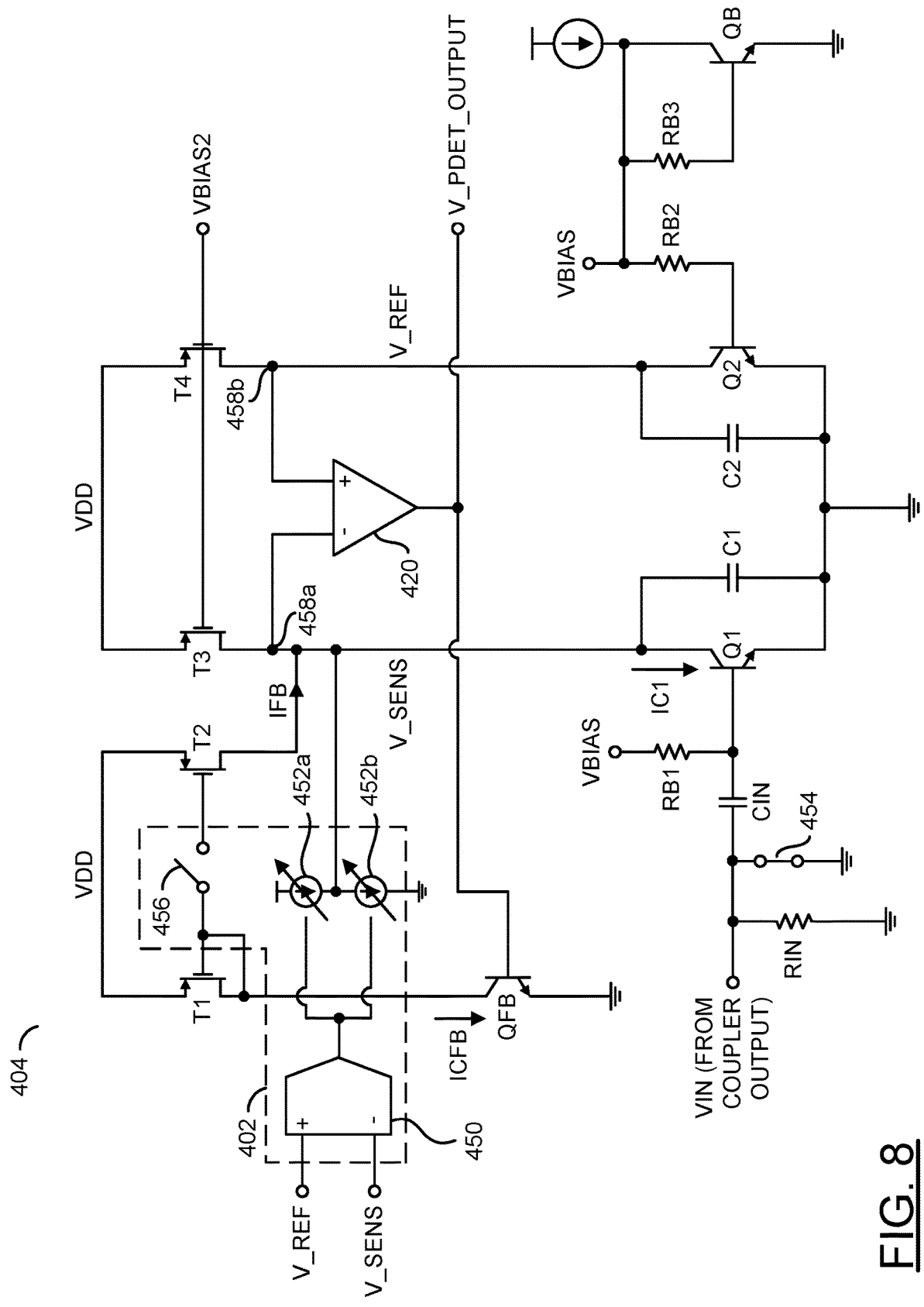
FIG. 8 is a diagram illustrating an example implementation of a calibration circuit implementing programmable current sources.

Referring to FIG. 8, a diagram illustrating an example implementation of the calibration circuit 402 implementing a programmable current sources is shown. Details of the linear-in-dB power detector 400 are shown. A schematic of the log amplifier 404 is shown with the calibration circuit 402. The circuit 404 may receive an input signal (e.g., VDD), an input signal (e.g., VBIAS), an input signal (e.g., VBIAS2) and/or the input signal VIN. The circuit 404 may present a signal (e.g., V_PDET_OUTPUT). The signal VDD may be a supply voltage. The signal VBIAS may be a bias voltage. The signal VBIAS2 may be a bias voltage. The signal VIN may be the RF input power (e.g., received from an output of the couplers 350*a*-350*b*). The signal V_PDET_OUTPUT may be an output of the power detector (e.g., a measurement of power in dB). In an example, the signal V_PDET_OUTPUT may correspond to the signal VOUT shown in association with FIG. 7. The circuit 404 may comprise other input and/or output signals. The number, type and/or values of the input and/or output signals may be varied according to the design criteria of a particular implementation.

The circuit 404 may comprise transistors T1-T4, bipolar junction transistors (BJT) Q1-Q2, a BJT QB, a BJT QFB, capacitors C1-C2, a capacitor CIN, a resistor RIN, resistors RB1-RB3, the calibration circuit 402 and/or an opamp 420. The calibration circuit 402 may comprise a comparison circuit 450, programmable current sources 452*a*-452*b*, a switch 454 and/or a switch 456. The circuit 404 and/or the calibration circuit 402 may comprise other components (not shown). The number, type and/or arrangement of the circuit 404 and/or the calibration circuit 402 may be varied according to the design criteria of a particular implementation.

The signal VIN may be presented to a base of the BJT Q1. The resistor RIN may be connected between the input signal VIN and ground. In an example, the resistor RIN may be approximately 50 Ohms. The switch 454 may be connected between the input signal VIN and ground. The capacitor CIN may be connected between the base of the BJT Q1 and the input signal VIN. The resistor RB1 may be connected between the base of the BJT Q1 and the input VBIAS.

In the example shown, the BJT Q1 and the BJT Q2 may have an NPN configuration as one illustrative embodiment. A collector of the BJT Q1 may be connected to a node 458*a*. The emitter of the BJT Q1 may be connected to ground and the emitter of the BJT Q2. The capacitor C1 may be connected across the collector and the emitter of the BJT Q1 (e.g., to filter out the RF signal and/or harmonics of the RF signal). A current IC1 is shown at the collector of the BJT Q1. A collector of the BJT Q2 may be connected to a node 458*b*. An emitter of the BJT Q2 may be connected to ground and the emitter of the BJT Q1. The capacitor C2 may be connected across the collector and the emitter of the BJT Q2.

The base of the BJT Q2 may receive the input VBIAS. The resistor RB2 may be connected between the input VBIAS and the base of the BJT Q2. One end of the resistor RB3 may be connected between the input VBIAS and a current source connected to the collector of the BJT QB. Another end of the resistor RB3 may be connected to a base of the BJT QB. The emitter of the BJT QB may be connected to ground. In the example shown, the BJT QB may have an NPN configuration as one illustrative embodiment. Generally, the BJT Q1, the BJT Q2 and/or the BJT QB may form a detection circuit. Instead of the BJT Q1, the BJT Q2 and/or the BJT QB, the detection circuit may be implemented using FETs, diodes and/or other components according to the design criteria of a particular implementation.

In the example shown, the transistor T3 and the transistor T4 may have a P-channel configuration (e.g., PFETs) as an illustrative embodiment. Generally, the transistor T3 and the transistor T4 may a bias control circuit for the power detector 400. Instead of the transistor T3 and/or the transistor T4, the bias control circuit may be implemented using PNPs, NPNs, NFETs and/or other components according to the design criteria of a particular implementation. The source of the transistor T3 and the source of the transistor T4 may both be connected to the input VDD. The gate of the transistor T3 and the gate of the transistor T4 may be connected to the input VBIAS2. The drain of the transistor T3 may be connected to the node 458a. The drain of the transistor T4 may be connected to the node 458b.

In the example shown, the BJT QFB may have an NPN configuration as an illustrative embodiment. In another example, the BJT QFB may have a PNP configuration. Generally, the BJT QFB may be implemented as a BJT in order to provide an exponential relationship between current and voltage. Implementing the BJT QFB as feedback may create the log amplifier. The base of the BJT QFB may be connected to an output of the opamp 420. The output of the opamp 420 may be the output signal V_PDET_OUTPUT. The emitter of the BJT QFB may be connected to ground. The collector of the BJT QFB may be connected to the drain and gate of the transistor T1 (and the gate of the transistor T2 if the switch 456 is closed).

In the example shown, the transistor T1 and the transistor T2 may have a P-channel configuration (e.g., PFETs) as an illustrative embodiment. Generally, the transistor T1 and the transistor T2 may form a feedback loop for the log amplifier. Instead of the transistor T1 and/or the transistor T2, the feedback loop may be implemented using PNPs, NPNs, NFETs and/or other components according to the design criteria of a particular implementation. The source of the transistor T1 and the source of the transistor T2 may both be connected to the input VDD. The gate of the transistor T1 may be connected to the gate of the transistor T2, the drain of the transistor T1 and the collector of the BJT QFB. The gate of the transistor T2 may be disconnected when the switch 456 is open. A current ICFB is shown at the collector of the BJT QFB. The switch 456 may be located between the gate of the transistor T1 and the gate of the transistor T2. The drain of the transistor T2 may be connected to the node 458a. A current IFB is shown from the drain of the transistor T2 to the node 458a.

The node 458a may be connected to the drain of the transistor T2, the drain of the transistor T3, the capacitor C1 and the collector of the BJT Q1. The node 458a may be connected to the negative terminal of the opamp 420. A voltage (e.g., V_SENS) may be at the node 458a.

The node 458b may be connected to the drain of the transistor T4, the collector of the BJT Q2 and the capacitor C2. The node 458b may be connected to the positive terminal of the op amp 420. A voltage (e.g., V_REF) may be at the node 458b.

During an operational mode of the power detector 400, the input power VIN may be applied. Generally, as the RF power of the signal VIN increases, the current IC1 at the BJT Q1 may increase. Increasing the current IC1 may result in a decrease of the voltage V_SENS. The voltage V_SENS may be lowered due to class A-B operation. The voltage V_SENS may be generated internally by the power detector 400 in response to a power detection of the power detector 400 (e.g., in response to the voltage VIN generated by the power source 406). During the operational mode of the power detector 400, the switch 454 may be open and the switch 456 may be closed (e.g., a closed loop configuration). In the closed loop configuration, the power detector 400 may generate the linear-in-dB power detection.

The voltage V_SENS at the node 458a may be applied to the negative terminal of the opamp 420. The voltage V_REF at the node 458b may be applied to the positive terminal of the opamp 420. In an example, the voltage V_REF may be generated in response to the reference circuit 408. The opamp 420 may generate the output signal V_PDET_OUTPUT (e.g., VOUT) in response to the difference (e.g., an offset) between the voltage applied at the negative terminal (e.g., V_SENS) and the voltage applied at the positive terminal (e.g., V_REF). The voltage V_PDET_OUTPUT may provide the linear-in-dB power detection. In one example, the linear-in-dB power detection may be provided to the controller 354 and the controller 354 may adjust a power level of the transceiver circuit 310 in response to the power detection.

When the voltage V_SENS is lowered, the output of the opamp 420 (e.g., a voltage presented as VOUT) increases. Increasing the output of the opamp 420 may result in an increase of the current ICFB. Increasing the current ICFB may result in an increase of the current IFB applied to the node 458a. The increase of the current IFB may eventually increase the voltage V_SENS to an amount equal to the voltage V_REF (e.g., V_SENS=V_REF).

Generally, as power is increased in the dB scale, the current IC1 may increase exponentially. The exponential increase of the current IC1 may result in the current IFB increasing exponentially as compensation. To generate the exponential relationship between the current IFB and the input VIN, the voltage at the base of the BJT QFB may need to be configured to increase linearly to provide the linear-in-dB power detection of the power detector 400.

Without the calibration implemented by the calibration circuit 402, a lower power range of the log amplifier 404 may be limited when there is a mismatch (e.g., an offset) between V_REF and V_SENS. In one example, when V_REF is greater than V_SENS, the output VOUT may flatten at lower power levels. Mismatches may result when V_SENS is higher than V_REF.

The calibration circuit 402 may perform a calibration when the input RF power is disabled (e.g., zero). The calibration may be configured to determine the relationship between V_SENS and V_REF as a result of mismatches and/or PVT variations. The calibration circuit 402 may be configured to disable the input and/or the output of the log amplifier 404. Disabling the input may enable the calibration to be performed in an open loop configuration. Based on the calibration performed by the calibration circuit 402, the mismatch (e.g., offset) may be canceled (e.g., reduced and/or eliminated). The mismatch may be canceled by setting the voltage V_SENS to be slightly lower than the voltage V_REF. The cancellation of the offset may extend the working range (e.g., detection range) of the power detection circuit 400.

The calibration circuit 402 may be configured to disconnect the input power VIN. In the example shown in association with FIG. 8, the power detector 400 may be in a calibration mode. The switch 454 may be closed to disconnect the input power VIN. The switch 454 may short the input VIN but may not affect the VBIAS DC current applied to the base of the BJT Q1. The calibration circuit 402 may be configured to disconnect the output power. For example, the switch 456 may be opened to disconnect the log amplifier loop. The open loop configuration may be enabled by closing the switch 454 and opening the switch 456.

The calibration performed by the offset cancellation circuit 402 may reduce and/or eliminate an offset between the negative terminal and the positive terminal of the opamp 420 when no RF power is present. When no RF input power is present (e.g., in the calibration mode when the switch 454 shorts the input VIN, but the voltage VBIAS is still applied), the difference present between the negative terminal and the positive terminal may be the mismatch. Unless the calibration is performed, the mismatch may be present when the power detector 400 is in the operational mode. The mismatch that may occur when no RF power is present may affect the output VOUT during the operational mode. In an example, the effects of the mismatch on VOUT may prevent the power detection circuit 400 from accurately measuring the power when the input power is low. The results of the calibration may be used to counteract the effects of the mismatch during the operational mode.

A chip controller of the RF transceiver system 80 may be configured to control the switch 454 and/or the switch 456. In one example, the switch 454 and/or the switch 456 may be opened/closed based on an input from the controller 86 shown in association with FIG. 1. In another example, the switch 454 and/or the switch 456 may be opened/closed based on an input from the controller 354 shown in association with FIGS. 5-6. The controller 86 (or the controller 354) may configure the phased array antenna panel 100 in a transmitting mode or a receiving mode. Since the controller 86 selects the mode of operation (and may track a currently selected mode of operation based on a stored flag, status bits, etc.), the controller 86 may enable the calibration when the system 80 is not transmitting/receiving. In one example, the controller 86 may run the calibration once at a startup time (e.g., since the calibration may primarily counteract mismatches and the mismatches may not change rapidly). In another example, the controller 86 may run the calibration when there is a change in temperature and/or supply conditions. Generally, the calibration circuit 402 may adjust the switch 454 and/or the switch 456 in response to an input from an external source. The external source that provides the input to the calibration circuit 402 to enable/disable calibration by adjusting the switch 454 and/or the switch 456 may be varied according to the design criteria of a particular implementation.

The comparison circuit 450 may be configured to sample the voltage V_SENS and the voltage V_REF. For example, the voltage V_REF may be applied to a positive terminal of the comparison circuit 450 and the voltage V_SENS may be applied to a negative terminal of the comparison circuit 450. The output of the comparison circuit 450 may be connected to the programmable current sources 452a-452b. The current source 452a may be connected between VDD and the node 458a. The current source 452b may be connected between the node 458a and ground. Based on the comparison (e.g., difference) of the voltage V_SENS and the voltage V_REF (e.g., when the input power VIN is disconnected), the current sources 452a-452b may adjust the voltage V_SENS at the node 458a. In the example, a calibration mode with one possible calibration mechanism using the current sources 452a-452b feeding to the V_SENS line is shown. The calibration circuit 402 may implement other calibration mechanisms (e.g., to be described in association with FIGS. 9-11). In some embodiments, diodes may be implemented instead of the NPNs Q1 and Q2 with current sources at the bottom instead of top.

The power detector 400 may implement a power detector offset calibration loop using the circuit 402. During the offset calibration mode, the operational loop of the log amplifier 404 may be always open. In one example, the calibration circuit 402 may have a closed loop mechanism, where the circuit 400 is automatically tuned by a calibration controller such that the offset is cancelled. In another example, the calibration circuit 402 may have an open loop mechanism, where the calibration controls are swept and the output of the differential amplifier 420 are registered. A look-up table and/or setting may be generated (e.g., by the controller 354), which may then be applied back to the power detector 400 for offset cancellation.

Figure 9:
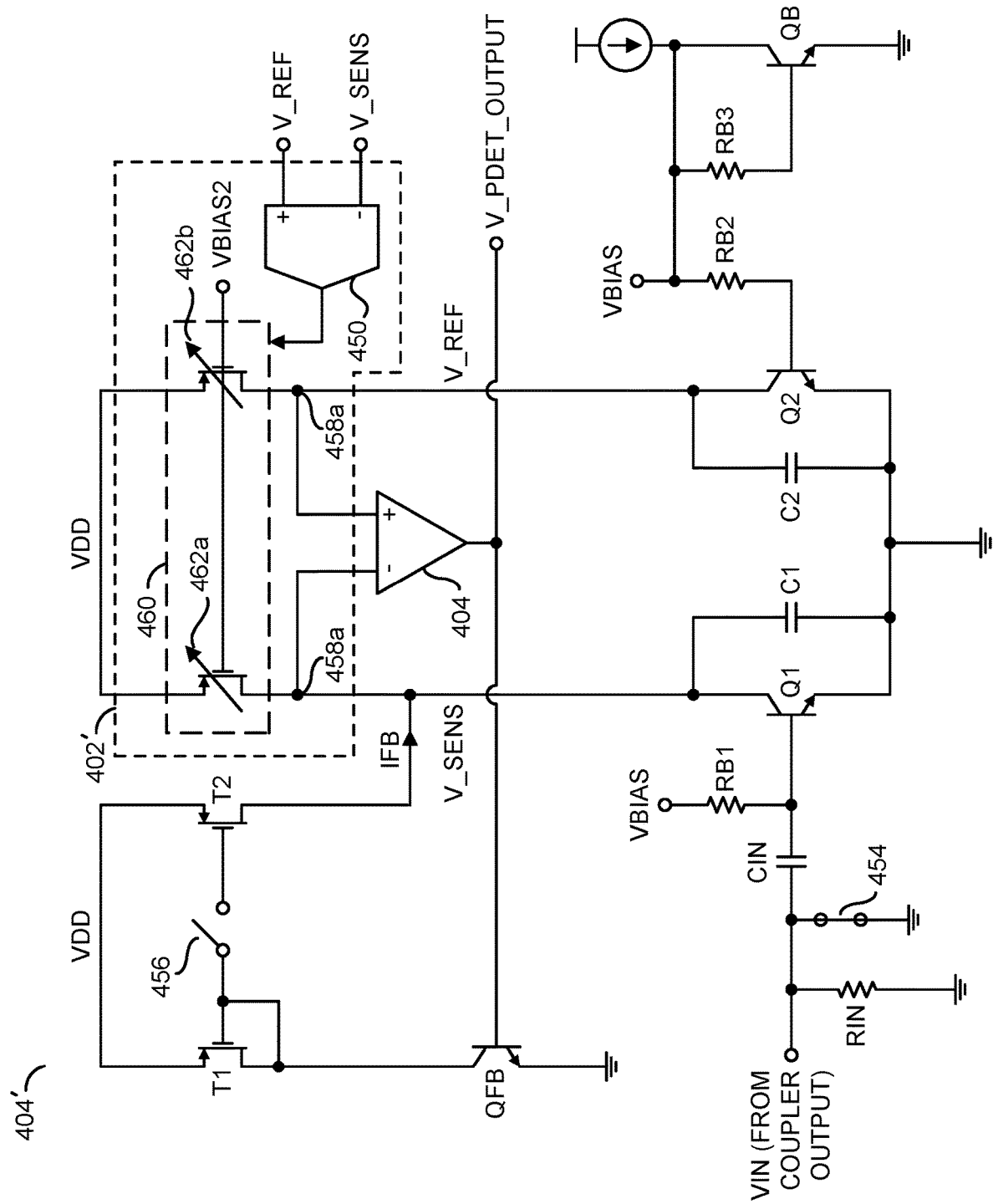
FIG. 9 is a diagram illustrating an example implementation of a calibration circuit implementing a programmable current source.

Referring to FIG. 9, a diagram illustrating an example implementation of the calibration circuit 402' implementing a programmable current source is shown. The log amplifier 404' may have a similar configuration as described in association with FIG. 8. The calibration circuit 402' is shown having programmable current source devices instead of the transistor T3 and the transistor T4 (e.g., at the top connected to VDD).

The calibration circuit 402' may comprise the comparison circuit 450 and a circuit 460. The comparison circuit 450 may provide an output (e.g., a difference) in response to a comparison of the voltage V_REF and the voltage V_SENS. The output of the comparison circuit 450 may be provided to the circuit 460.

The circuit 460 may comprise a circuit 462a and a circuit 462b. In one example, the circuits 462a-462b may implement variable current sources. The output of the comparison circuit 450 may be configured to control the strength of (e.g., amount of current supplied by) the circuits 462a-462b. The output of the circuits 462a-462b may be adjusted to set the voltage V_SENS and/or the voltage V_REF (e.g., to set V_SENS slightly lower than V_REF) to counteract the mismatch.

Figure 10:
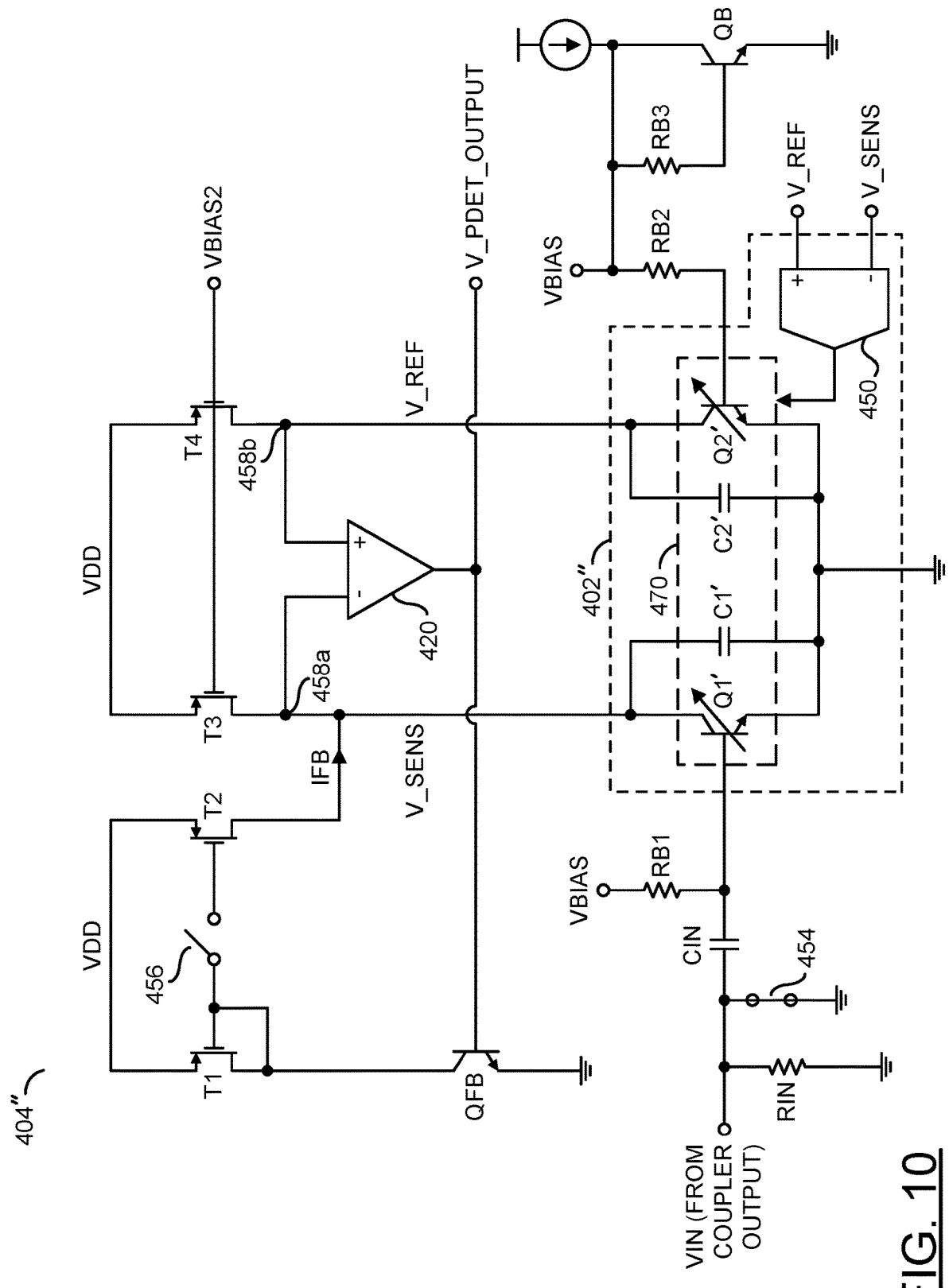
FIG. 10 is a diagram illustrating an example implementation of a calibration circuit implementing programmable input detection devices.

Referring to FIG. 10, a diagram illustrating an example implementation of the calibration circuit 402" implementing programmable input detection devices is shown. The log amplifier 404" may have a similar configuration as described in association with FIG. 8. The calibration circuit 402" is shown having programmable input detection devices Q1' and/or Q2' (e.g., at the bottom connected to VBIAS).

The calibration circuit 402" may comprise the comparison circuit 450 and a circuit 470. The comparison circuit 450 may provide an output (e.g., a difference) in response to a comparison of the voltage V_REF and the voltage V_SENS. The output of the comparison circuit 450 may be provided to the circuit 470.

The circuit 470 may comprise a programmable input detection device Q1', the capacitor C1', the capacitor C2' and/or a programmable input detection device Q2'. In one example, the input detection devices Q1'-Q2' may be variable BJTs. The output of the comparison circuit 450 may be configured to control the strength of (e.g., amount of current supplied by) the variable BJTs Q1'-Q2' by changing the size. The output of the variable BJTs Q1'-Q2' may be adjusted to set the voltage V_SENS and/or the voltage V_REF (e.g., to set V_SENS slightly lower than V_REF) to counteract the mismatch.

Figure 11:
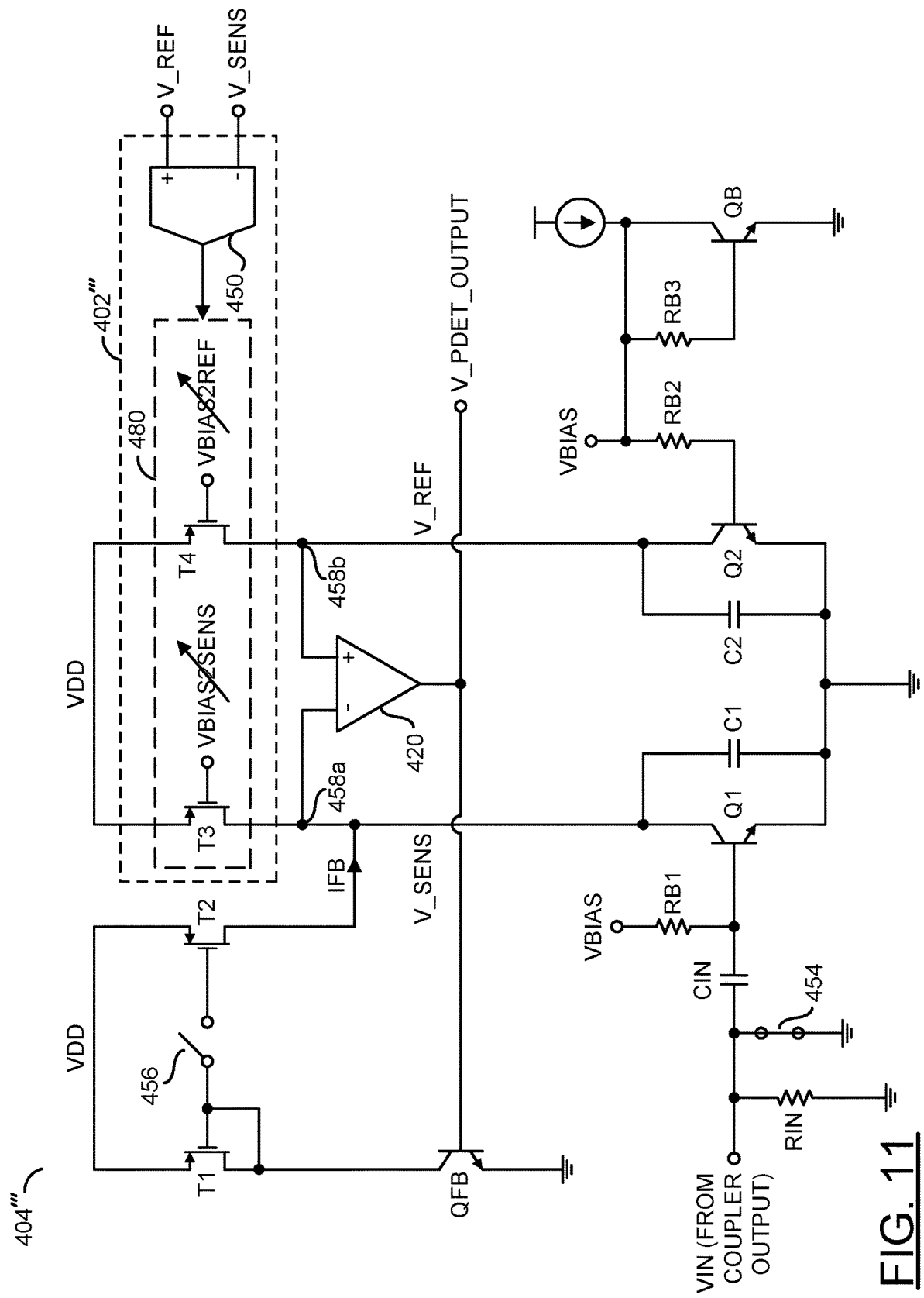
FIG. 11 is a diagram illustrating an example implementation of a calibration circuit implementing programmable bias voltages.

Referring to FIG. 11, a diagram illustrating an example implementation of the calibration circuit 402'" implementing programmable bias voltages is shown. The log amplifier 404'" may have a similar configuration as described in association with FIG. 8. The calibration circuit 402'" is shown having programmable bias voltages for the current sources T3-T4.

The calibration circuit 402'" may comprise the comparison circuit 450 and a circuit 480. The comparison circuit 450 may provide an output (e.g., a difference) in response to a comparison of the voltage V_REF and the voltage V_SENS. The output of the comparison circuit 450 may be provided to the circuit 480.

The circuit 480 may comprise the transistor T3 with a variable gate voltage (e.g., VBIAS2SENS) and the transistor T4 with a variable gate voltage (e.g., VBIAS2REF). The voltage VBIAS2SENS and/or the voltage VBIAS2REF may be adjusted in response to the output of the comparison circuit 450. The voltage VBIAS2SENS and/or the voltage VBIAS2REF may be adjusted to set the voltage V_SENS and/or the voltage V_REF (e.g., to set V_SENS slightly lower than V_REF) to counteract the mismatch.

Figure 12:
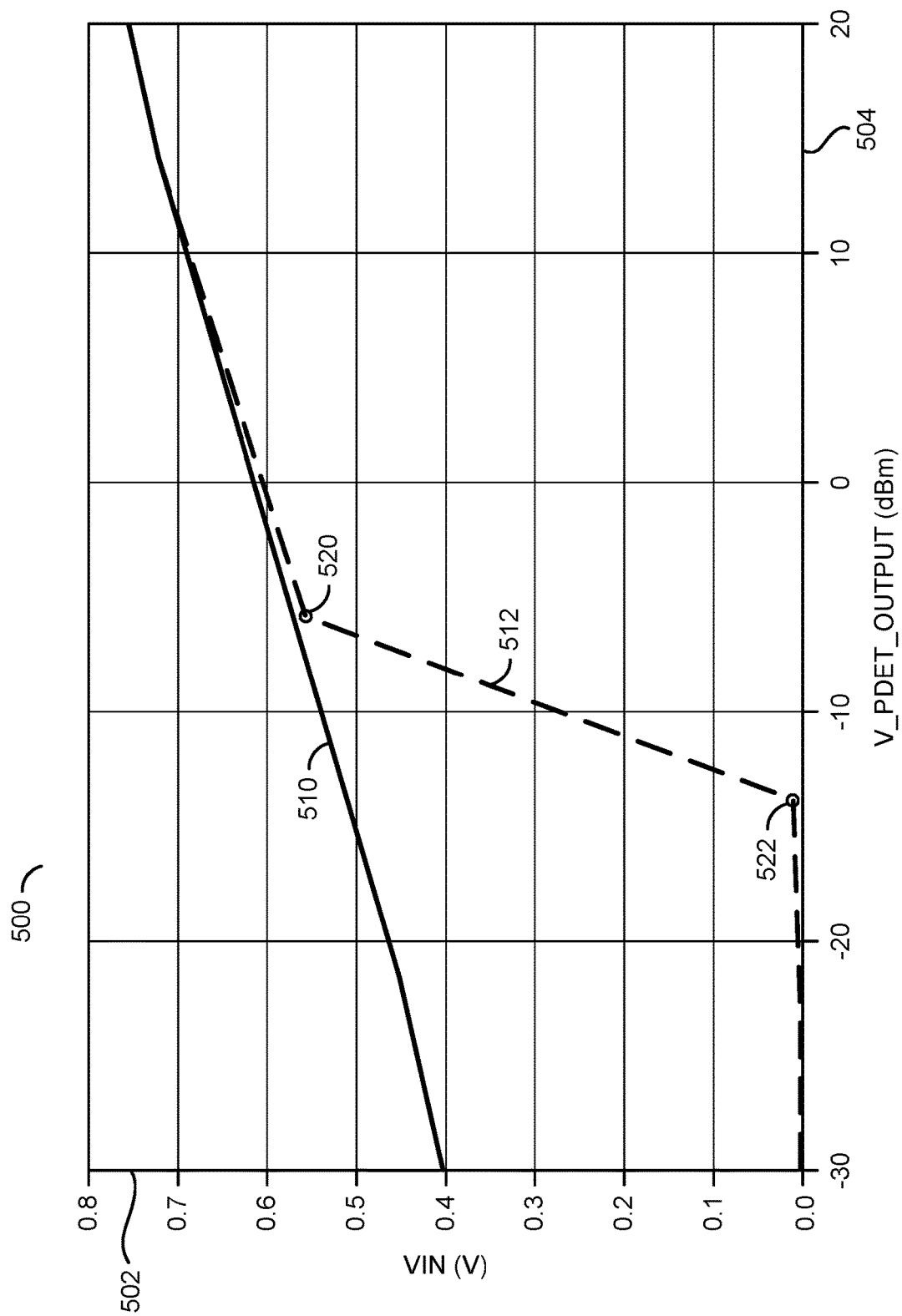
FIG. 12 is a graph diagram illustrating a working range of the power detection circuit when the detector has an offset such that V_SENS is greater than V_REF with no RF input present.

Referring to FIG. 12, a graph diagram 500 illustrating a working range of the power detection circuit 400 when the detector has an offset such that V_SENS is greater than V_REF with no RF input present is shown. The graph 500 may comprise an axis 502 and an axis 504. The axis 502 may represent the voltage VIN measured in volts. The axis 504 may represent the output voltage V_PDET_OUTPUT (e.g., VOUT) measured in decibels with reference to a milliwatt.

A line 510 and a line 512 is shown on the graph 500. The line 510 may correspond to a scenario when the calibration circuit 402 is implemented. The line 512 may correspond to a scenario when the calibration circuit 402 is not implemented. The graph 500 may correspond to a scenario when the voltage V_SENS is greater than V_REF without RF input. In an example, the graph 500 may represent a Monte Carlo simulation.

The line 512 may comprise a point 520 and a point 522. The point 520 may correspond to approximately the voltage 0.55V and −5 dBm. The point 522 may correspond to approximately −15 dBm and 0V. Without calibration, the output may be approximately 0V at low power input. When the RF input power increases to a level such that V_SENS falls below V_REF then the feedback (e.g., IFB) may kick in and the output may be observed (e.g., at input power above −5 dBm in the example shown).

The line 510 shows that the power detector 400 may provide an output at low voltage levels when the calibration circuit 402 is implemented. Implementing the calibration circuit 402 may extend the working range of the power detector 400. In an example, the sensitivity of the power detection circuit 400 may be improved by 5-10 dB (or greater than 10 dB) at the lower end.

Figure 13:
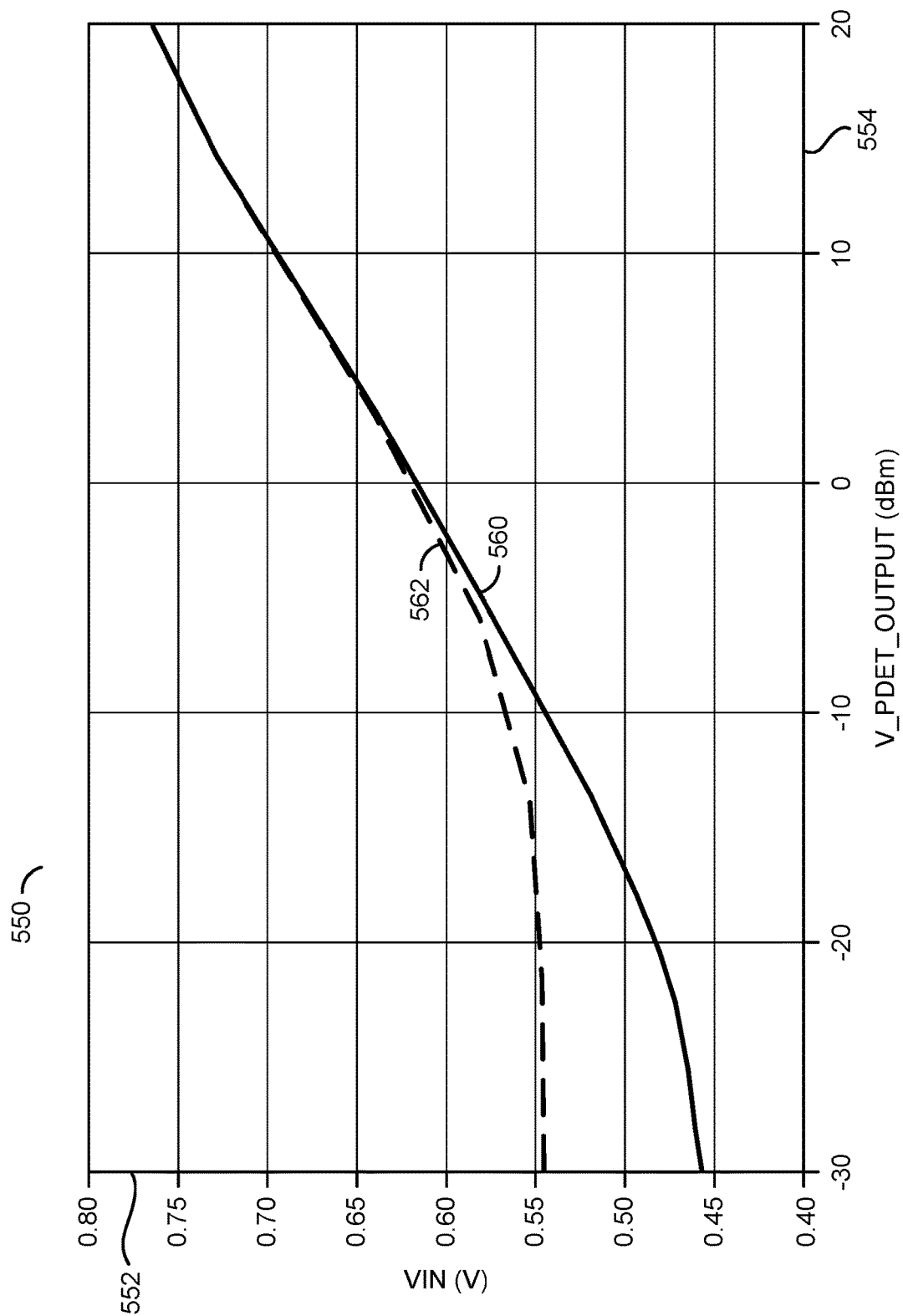
FIG. 13 is a graph diagram illustrating a working range of the power detection circuit when the detector has an offset such that V_SENS is less than V_REF with no RF input present.

Referring to FIG. 13, a graph diagram 550 illustrating a working range of the power detection circuit 400 when the detector has an offset such that V_SENS is less than V_REF with no RF input present is shown. The graph 550 may comprise an axis 552 and an axis 554. The axis 552 may represent the voltage VIN measured in volts. The axis 554 may represent the output voltage V_PDET_OUTPUT (e.g., VOUT) measured in decibels with reference to a milliwatt.

A line 560 and a line 562 is shown on the graph 550. The line 560 may correspond to a scenario when the calibration circuit 402 is implemented. The line 562 may correspond to a scenario when the calibration circuit 402 is not implemented. The graph 550 may correspond to a scenario when the voltage V_SENS is less than V_REF without RF input. In an example, the graph 550 may represent a Monte Carlo simulation.

In the example shown, at low power levels (e.g., less than −10 dBm) the line 562 (e.g., uncalibrated) may flatten out. The power levels may flatten out as the feedback current may not decrease with the RF input. The calibrated example line 560 may not flatten out at lower power levels. Implementing the calibration circuit 402 may extend the working range of the power detector 400. In an example, the sensitivity of the power detection circuit 400 may be improved by 5-10 dB (or greater than 10 dB) at the lower end.

The functions performed by the diagrams of FIGS. 1-13 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a log amplifier circuit configured to generate an output signal in response to an offset between a first voltage and a second voltage; and
   a calibration circuit configured to (i) disconnect an input power and (ii) perform a cancellation of said offset when said input power is not present,
   wherein
   (a) said first voltage is generated by said apparatus in response to a power detection,
   (b) said second voltage is received from a reference circuit,
   (c) said cancellation of said offset extends a working range of said apparatus,
   (d) said output signal provides a linear-in-dB power detection,
   (e) said calibration circuit comprises a comparison circuit configured to determine a difference between said first voltage and said second voltage when said input power is not present,
   (f) said difference is used to control one or more programmable current sources, and
   (g) said cancellation is performed by adjusting said programmable current sources in response to said difference.

2. The apparatus according to claim 1, wherein said log amplifier circuit is configured to enable a log correction in an analog domain.

3. The apparatus according to claim 1, wherein said working range is extended by setting said first voltage slightly lower than said second voltage.

4. The apparatus according to claim 1, wherein said calibration circuit is configured to disconnect said input power and perform said cancellation in an open loop configuration.

5. The apparatus according to claim 4, wherein said calibration circuit enables said open loop configuration by closing a first switch to disconnect said input power and opening a second switch to disable an amplifier.

6. The apparatus according to claim 1, wherein said cancellation is performed by an open-loop mechanism.

7. The apparatus according to claim 1, wherein said cancellation is performed by a closed-loop mechanism.

8. The apparatus according to claim 1, wherein said cancellation reduces said offset or eliminates said offset.

9. The apparatus according to claim 1, wherein (i) said apparatus is configured to generate said linear-in-dB power detection in a closed loop configuration and (ii) perform a calibration of said offset in an open loop configuration.

10. The apparatus according to claim 1, wherein (i) said linear-in-dB power detection is provided to a controller circuit and (ii) said controller circuit is configured to adjust a power level of a transceiver circuit in response to said linear-in-dB power detection.

11. The apparatus according to claim 1, wherein (i) said difference is used to control a first current source for said first voltage and a second current source for said second voltage, (ii) said first current source and said second current source are implemented using FET transistors in a P-channel configuration and (iii) said cancellation is performed by adjusting a strength of said first current source and said second current source in response to said difference.

12. The apparatus according to claim 1, wherein (i) said difference is used to control a first current of a first input device and a second current of a second input device, (ii) said first input device and said second input device are implemented using transistors in a NPN configuration and (iii) said cancellation is performed by adjusting a strength of said first current and said second current in response to said difference.

13. The apparatus according to claim 1, wherein (i) said difference is used to control a first bias voltage of a first current source and a second bias voltage of a second current source and (ii) said cancellation is performed by adjusting said first bias voltage and said second bias voltage in response to said difference.

14. The apparatus according to claim 1, wherein said working range of said apparatus is extended by approximately 5 dB to 10 dB.

15. The apparatus according to claim 1, wherein said calibration circuit disconnects said input power in response to an input from a controller.

16. The apparatus according to claim 15, wherein said controller provides said input at a startup time of a phased array antenna panel.

17. The apparatus according to claim 1, configured to implement a linear-in-dB log-amp with calibration for power detection.

* * * * *